United States Patent
Oh

(10) Patent No.: US 8,655,115 B2
(45) Date of Patent: Feb. 18, 2014

(54) INTEGRATED POLYMER OPTICAL WAVEGUIDE CURRENT SENSOR

(75) Inventor: Min-Cheol Oh, Busan (KR)

(73) Assignees: Pusan National University Industry-University Cooperation Foundation, Busan (KR); Jeongkwan Co., Ltd., Gyeongsangnam-do (KR)

( * ) Notice: Subject to any disclaimer, the term of this patent is extended or adjusted under 35 U.S.C. 154(b) by 0 days.

(21) Appl. No.: 13/322,004

(22) PCT Filed: May 25, 2009

(86) PCT No.: PCT/KR2009/002766
§ 371 (c)(1),
(2), (4) Date: Feb. 6, 2012

(87) PCT Pub. No.: WO2010/137752
PCT Pub. Date: Dec. 2, 2010

(65) Prior Publication Data
US 2012/0121216 A1     May 17, 2012

(51) Int. Cl.
```
G02F 1/01      (2006.01)
G02B 6/00      (2006.01)
G01J 4/00      (2006.01)
G02B 1/10      (2006.01)
G02B 5/30      (2006.01)
G01J 1/04      (2006.01)
G01J 5/08      (2006.01)
```
(52) U.S. Cl.
USPC .................................. 385/1; 385/12; 385/37
(58) Field of Classification Search
USPC .................. 385/11–14, 1, 138, 147; 359/334; 257/686
See application file for complete search history.

(56) References Cited

U.S. PATENT DOCUMENTS

| | | | |
|---|---|---|---|
| 5,315,673 A * | 5/1994 | Stetter et al. | 385/12 |
| 6,511,222 B1 * | 1/2003 | Bouamra | 374/161 |
| 6,512,357 B2 | 1/2003 | Bosselmann et al. | |
| 7,379,633 B1 * | 5/2008 | Ashley et al. | 385/14 |
| 7,495,207 B2 * | 2/2009 | Ogura et al. | 250/227.14 |
| 8,120,595 B2 * | 2/2012 | Kukulj et al. | 345/176 |

(Continued)

FOREIGN PATENT DOCUMENTS

| | | |
|---|---|---|
| JP | 2000-039528 A | 2/2000 |
| JP | 2004-361196 A | 12/2004 |

(Continued)

OTHER PUBLICATIONS

International Search Report and Written Opinion for International Patent Application No. PCT/KR2009/002766, mailed Feb. 26, 2010.

(Continued)

*Primary Examiner* — Akm Enayet Ullah
(74) *Attorney, Agent, or Firm* — Alston & Bird LLP

(57) ABSTRACT

Provided is an integrated optical current sensor for measuring the magnitude of current. The integrated optical current sensor is fabricated by integrating optical elements, such as a thermo-optic phase modulator, a waveguide polarizer and an optical coupler, on a single substrate. As compared to the known current sensors using optical fibers, the integrated optical current sensor is more compact and enables measurement of current with higher reliability. Provided also is a method for producing current sensor chips in a large scale by using a process for fabricating integrated optical elements.

8 Claims, 3 Drawing Sheets

(56) References Cited

U.S. PATENT DOCUMENTS

| | | |
|---|---|---|
| 2004/0101228 A1 | 5/2004 | Bohnert |
| 2004/0246467 A1* | 12/2004 | Bohnert et al. ............... 356/138 |
| 2005/0088662 A1 | 4/2005 | Bohnert et al. |

FOREIGN PATENT DOCUMENTS

| | | |
|---|---|---|
| JP | 2005-517961 A | 6/2005 |
| JP | 2007-040884 A | 2/2007 |
| KR | 10-2001-0006008 A | 1/2001 |

OTHER PUBLICATIONS

Oh, M. et al., *TE-pass and TM-pass Waveguide Polarizers with Buried Birefringence Polymer,* Electronics Letters, vol. 35, No. 6 (1999) pp. 471-472.

Oh, M. et al., *Asymmetric X-Junction Thermooptic Switches Based on Fluorinated Polymer Waveguides,* IEEE Photonics Technology Letters, vol. 10, No. 6 (1998) pp. 813-815.

Noh, Y. et al., *Polymer Waveguide Variable Optical Attenuator and its Reliability,* Optics Communications, vol. 242 (2004) pp. 533-540.

\* cited by examiner

INTEGRATED POLYMER OPTICAL WAVEGUIDE CURRENT SENSOR

CROSS REFERENCE TO RELATED APPLICATIONS

This application is a national stage application filed under 35 U.S.C. 371 of International Application No. PCT/KR2009/002766, filed May 25, 2009, which is incorporated herein in its entirety.

TECHNICAL FIELD

The present disclosure relates to a polymer optical waveguide current sensor, and more particularly, to an integrated optical waveguide current sensor that may be obtained by integrating optical waveguide elements fabricated on the basis of polymer optical waveguide technology on a single chip.

BACKGROUND ART

In general, optical sensors for measuring current have been fabricated by using optical fibers. Such optical sensors for measuring current are characterized in that they enable non-contact current measurement while not causing any change in properties of an electric circuit through which current flows. As compared to hall effect sensors used widely as non-contact measuring sensors, optical sensors for measuring current are advantageous in that they prevent interference caused by electromagnetic waves existing always around a system using high current and enable precise current measurement.

However, optical sensors for measuring current have been limited in their applications despite the above-mentioned advantages because optical components forming the sensors are expensive. As optical communication technology has developed, various kinds of optical components have been developed and sold at low cost in the market. However, the components required for forming optical sensors for measuring current are still expensive. Therefore, it is a precondition for extending applications of a new optical sensor for measuring current to develop low-cost components for optical sensors for measuring current and high-performance sensors using the same.

The principle of optical sensors for measuring current is measuring a change in polarization of light waves propagating along optical fibers under the effect of the adjacent magnetic field. Such a change in polarization caused by a magnetic field is called the Faraday effect. However, since silica materials forming optical fibers have a very weak Faraday effect, such a weak effect may be amplified by allowing light to propagate through the optical fibers surrounding electric wires. When measuring a weak magnetic field, electric wires may be surrounded with optical fibers by winding the optical fibers around the electric wires at least 10 times, so that the Faraday effect may be amplified in proportion to the propagation distance.

Optical sensors for measuring current ideally cause a change in polarization merely by an electric field. However, there is a problem in that polarization may also be changed by a change in surrounding temperatures or vibration of optical fibers. To solve this, many studies have been conducted about current sensors using polarization-maintaining optical fibers (Fiber-optic current sensor, US 2004/0101228 A1, published on 05.27.2004; Reflection type optical fiber current sensor, JP 2007-040884, published on 02.15.2007; Temperature-stabilized sensor coil and current sensor, US 2005/0088662 A1, published on 04.28.2005). However, such current sensors using polarization-maintaining optical fibers essentially require the polarization-maintaining optical fibers not only in a linear polarization converter and circular polarization converter for controlling polarization but also in additional optical components, such as an optical coupler and a phase modulator. This may result in a complicated system and an increase in cost.

There has been an attempt to integrate some of components essentially required in optical sensors for measuring current, i.e., a polarizer and an optical coupler, on a single chip to provide current sensors (Waveguide type optical part and optical fiber current sensor using it, JP 2000-039528, published on 02.08.2000). However, JP 2000-039258 does not suggest any method for integrating all components forming optical current sensors on a single chip. Moreover, a limited number of optical components may be realized in the above-mentioned manner. Meanwhile, there has been suggest a sensor including an optical waveguide structure around an electric wire through which current flows to determine a change in polarization of the wave-guided light (Polarimetric sensor for the optical detection of a magnetic field and polarimetric sensor for the optical detection of an electric current, U.S. Pat. No. 6,512,357 B2, registered on 01.28.2003). However, the related art does not suggest or disclose about integration of optical components.

DISCLOSURE

Technical Problem

The present disclosure is directed to providing a sensor capable of measuring current by integrating optical components having various functions on a single chip. Such an integrated current sensor is more compact than the existing optical fiber current sensors, is fabricated by a simple process, and is amenable to mass production, thereby realizing a cost-efficient high-quality current sensor.

The present disclosure is also directed to using an optical element based on properties of polymeric materials to fabricate components forming an integrated current sensor.

The present disclosure is also directed to providing an integrated current sensor capable of substituting for an optical fiber current sensor by integrating core optical elements, such as a polymer optical waveguide phase modulator, polymeric optical waveguide polarizer and a polymer optical waveguide optical coupler, on a single silicon substrate together with the other optical components, such as a polarization converter, a current sensing optical waveguide coil and a phase delay optical waveguide coil, through a series of processing operations on the basis of a polymer optical waveguide structure having polarization-maintaining properties.

Technical Solution

In one general aspect, the present disclosure provides a polymer optical waveguide current sensor, including:

an optical coupler 10 to which light generated from a light source 100 is input;

an optical waveguide polarizer 20 allowing the light emitted from the optical coupler 10 to have a single polarized state;

a phase modulator 30 modulating a phase of the light emitted from the optical waveguide polarizer 20;

a linear polarization converter 40 converting the polarization of the light passed from the optical waveguide polarizer 20 and transferring the light to the phase modulator 30;

a current sensing optical fiber coil 70, through which the light passed from the phase modulator 30 passes while undergoing a change in phase under an effect of a magnetic field generated by current applied to an electric wire 1 provided at the center of the optical fiber coil; and a photo-detector 200 in which the light emitted from the current sensing optical fiber coil 70 reflects on a reflection mirror 90 to detect returned light, wherein the optical coupler 10, the optical waveguide polarizer 20, the phase modulator 30 and the linear polarization converter 40 are integrated totally on a single chip.

According to an embodiment of the optical waveguide current sensor disclosed herein, the optical coupler 10, the optical waveguide polarizer 20 and the phase modulator 30 each may be manufactured by using a polymer optical waveguide.

The phase modulator 30 may include a thin film heater 31 provided on the top of the optical waveguide 32, and the refraction index of the optical waveguide 32 may be changed by the heat generated from the thin film heater 31 under the application of current.

According to an embodiment, the optical waveguide sensor disclosed herein may further include:

a delay line 60 allowing light passed from a second optical waveguide polarizer 20a via the optical coupler 10 to appear as a delayed form on a time axis;

a second optical coupler 10a where the light passed from the phase modulator 30 meets the light passed from the delay line 60;

an optical attenuator 80 causing a loss of a portion of the light passed from the second optical coupler 10a; and a circular polarization converter 50 converting the polarization of another portion of the light passed from the second optical coupler 10a, wherein the light passed from the optical coupler 10 is allowed to cause interference at the second optical coupler 10a after being passed from the optical waveguide polarizer 20, the linear polarization converter 40 and the phase modulator 30 so that a phase condition of the light may be detected as a function of the magnitude of current.

The optical coupler 10 may be one using a directional optical coupler structure or a multi-mode interference system structure and may have identical operational properties regardless of the polarization of the wave-guided light.

The optical waveguide polarizer 20 may have a selective transmission property to either TE polarized light or TM polarized light, and may have a structure into which a birefringence polymer material is inserted or a structure using surface plasmon absorption of a metal thin film.

According to an embodiment, feedback signals applied to the phase modulator 30 may be controlled to allow the sensor to maintain a maximized signal magnitude, so that the optical sensor may be maintained at its optimized condition.

The linear polarization converter 40 may be obtained by inserting a thin film-like half-wave plate in the middle of the optical waveguide.

Advantageous Effects

According to the present disclosure, various optical elements having different functions required for an optical sensor for measuring current may be realized on a single substrate through a series of operations. Therefore, it is possible to realize a current-specific optical sensor operating stably regardless of a change in temperature and vibration by adopting polymer optical waveguide technology amenable to mass production with high cost efficiency.

The optical sensors using optical fibers according to the related art are disadvantageous in that they use expensive components and require a complicated process for assembling the components and producing sensors. On the contrary, the optical current sensor based on integrated-optic technology disclosed herein enables mass production of chips having identical functions on a single substrate through a series of processing operations by introducing an integrated circuit fabrication process. As a result, it is possible to reduce cost required for manufacturing optical current sensors and to extend the spectrum of applications thereof.

In addition, it is possible to realize hybrid type integrated optical current sensors using optical fiber elements as economical products through the simplification of manufacturing processes and constitutional parts as compared to the existing optical fiber type current sensors.

DETAILED DESCRIPTION OF MAIN ELEMENTS

Figure 1:
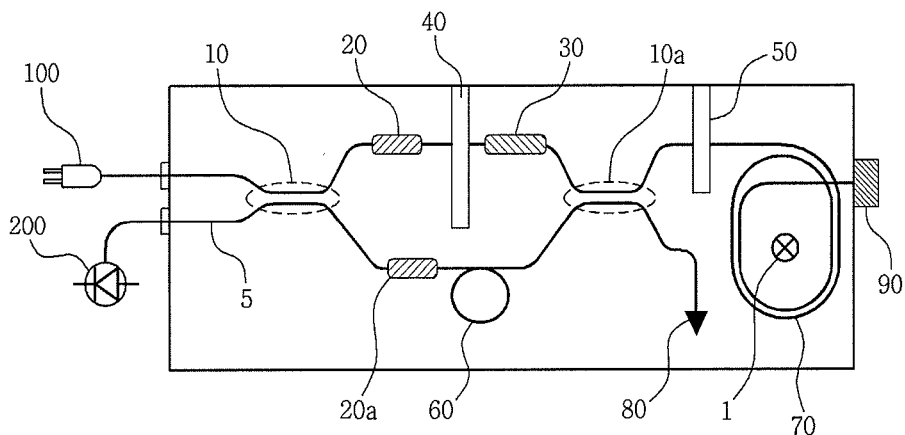
FIG. 1 is a schematic view of a polymer optical waveguide current sensor according to the present disclosure.

| | |
|---|---|
| 10: optical coupler | 20: optical waveguide polarizer |
| 30: phase modulator | 40: linear polarization converter |
| 50: circular polarization converter | 60: delay line |
| 70: current sensing optical fiber coil | |
| 80: optical attenuator | 90: reflection mirror |
| 100: light source | |

BEST MODE

First, the basic principle of the operation of an optical sensor for measuring current will be described. The optical sensor measures a change in polarization of light waves propagating through an optical waveguide, caused by the effect of the magnetic field applied along the direction of optical fibers. Such an interrelation between light waves and the magnetic field is called the Faraday effect, and the linear proportional factor is defined as the Verdet constant. Therefore, a medium having a larger Verdet constant causes a larger change in polarization of light waves under the effect of the applied magnetic field. When applying linear polarization, such a change in polarization of light waves appears in the form of deviation in output polarization corresponding to a certain angle in proportion to the intensity of the magnetic field due to the Faraday effect.

The above-described phenomenon may be explained considering circular birefringence imparted by the Faraday effect. In this case, a phase difference between two circularly polarized light rays divided from linearly polarized light is considered, wherein the phase difference is imparted by the Faraday effect. When the phase difference between the two circularly polarized light rays is changed by 180° due to the Faraday effect, the incident linearly polarized light undergoes a change in angle of 90°. In other words, transverse electric (TE) polarization is converted into transverse magnetic (TM) polarization. In addition, the incident linearly polarized light forms linearly polarized light rotated by a specific angle at the output unit depending on the magnitude of the phase difference between the two circularly polarized light rays. Therefore, in the case of a current sensor for measuring a magnitude of current, it is possible to obtain the value of applied current by measuring the angle of the output linearly polarized light.

The current sensor of the present disclosure based on the above-described basic principle of an optical sensor for measuring current may be realized by using a current sensor chip obtained by integrating optical waveguide elements and polarization-controlling components on a single substrate.

Use of an integrated optical waveguide element provides an optical sensor not by connecting individual components with optical fibers as in the case of an optical fiber element, but by integrating various kinds of optical components on a single substrate all at once. Such integration optical technology enables mass production of identical element chips on a single substrate through a process similar to a well-known silicon integrated circuit fabrication process, and provides small chips by integrating optical elements having complicated functions. When applying the above-mentioned technology to optical sensors for measuring current, it is possible to fabricate optical elements having specifically required functions through a single process and to realize high-quality low-cost optical current sensors.

Particularly, it is possible to fabricate optical current sensors by using properties of polymeric materials. Unlike other optical element materials, such as silica and semiconductors, polymeric materials may be applied to various processing methods. In particular, use of an imprinting method enables fabrication of highly cost-efficient elements. In addition, since polymeric materials have a very low light absorption loss in the visible range, they are advantageous in fabricating optical waveguides. Further, since polymeric materials show a larger change in refractive index caused by an increase in temperature as compared to the other materials, they are suitable for fabricating a phase modulator, optical switch, etc. using such properties. Moreover, since it is possible to hybridize two or more materials different in optical birefringence properties from each other, a polarization-controlling element may be obtained based on this. Ultimately, applying the above-described properties in a reasonable manner enables integration of different elements having different optical functions on a single substrate.

The polymer optical waveguide elements used herein may include a thermo-optic phase modulator, waveguide polarizer and optical coupler (3 dB coupler). To function as a current sensor, a linear polarization converter, a circular polarization converter (quarter wave plate), a current sensing optical waveguide coil and a delay line are further required. According to the optical sensor disclosed herein, it is possible to integrate all of the above-listed components on a single integrated current sensor.

Particularly, the thermo-optic phase modulator is an element that supplies current by using a metal thin film heater to generate heat, thereby causing a change in refractive index of an optical waveguide. The waveguide polarizer has transmission selectivity to either TE polarization or TM polarization and may be obtained by using a polymer material having birefringence property. The waveguide polarizer may be obtained by inserting a polymer material having birefringence property or by using surface plasmon absorption of a metal thin film after forming a thin upper cladding of a polymer optical waveguide. The optical coupler (3 dB coupler) means an element having a unique feature with which light power is divided in a ratio of 50:50 due to a directional coupling phenomenon generated between two adjacent polymer optical waveguides. The optical coupler uses a directional optical coupler structure or a multi-mode interference system structure, and has identical operation characteristics regardless of polarization of wave-guided light.

The above-described optical waveguide elements has an optical waveguide structure having birefringence property with which wave-guided light has a different effective refractive index depending on polarization so that wave-guided light rays having different polarization states may not cause coupling with each other.

In the case of an optical current sensor having basic functions, an electric wire is surrounded with optical fibers so that a magnetic field is formed along the optical fiber coils when linearly polarized incident light is input, and then a polarized light divider is provided at the output unit to measure the polarization of the output light. However, such a simple type optical sensor has not been practically applicable because of a change in polarization caused by the temperature of the optical fibers themselves and sensitivity to external vibration. To overcome such problems, a system using polarization-maintaining optical fibers and a polarization converter has been suggested. In addition, according to the present disclosure, there is suggested an integrated optical current sensor that may be fabricated in the form of a small chip while realizing the same characteristics as the above-mentioned optical current sensor.

The integrated optical current sensor chip according to an embodiment of the present disclosure has the structure as shown in FIG. 1. It can be seen that various optical components may be integrated on a single chip. Among such components, core parts to which polymer optical waveguide technology is applied include an optical coupler 10, an optical waveguide polarizer 20, a phase modulator 30, etc. In addition, the linear polarization converter 40 and the circular polarization converter 50 may be fabricated by forming a groove with a depth of about 50 μm on the optical waveguide vertically thereto and inserting a polarization controlling plate to the groove. The delay line 60, the current sensing optical waveguide coil 70 and the optical attenuator 80 may be fabricated by modifying the shape of a polymer optical waveguide. As a light source 100, a laser diode having a wide wavelength range and a non-determined polarization condition is used, and a general photo-detector 200 may be used.

Figure 2:
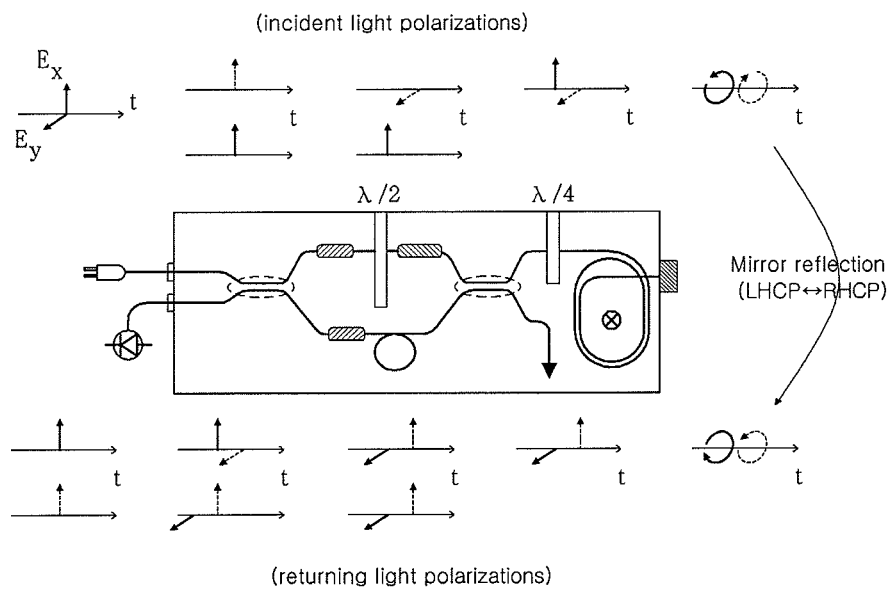
FIG. 2 is a schematic view showing a variation in polarization of wave-guided light in the polymer optical waveguide current sensor of FIG. 1.

FIG. 2 shows optical elements and a change in polarization of wave-guided light caused by each element to illustrate the principle of current measurement of the integrated optical current sensor according to the present disclosure. Referring to FIG. 1 and FIG. 2, the incident light input to the light source 100, i.e., the laser diode, passes through the optical coupler 10, where it is divided into two optical waveguides, i.e., an upper optical waveguide and a lower optical waveguide, and then passes through an optical waveguide polarizer 20 so that it is converted into a single polarized state. The light passed from the upper optical waveguide undergoes a change in polarization of 90° due to the linear polarization converter 40, while the light passed from the lower optical waveguide shows a delayed form on the time axis due to the delay line 60. The function of the phase modulator 30 present at the upper optical waveguide will be explained later. The light rays passed from the upper and lower optical waveguides are sent to a second optical coupler 10*a*, and they have different polarization states with a deviation of 90° and are spaced apart from each other on the time axis. The light propagating to the lower output line of the second optical coupler 10*a* is dissipated by the optical attenuator 80, and thus it disappears. The light propagating to the upper optical waveguide is sent to the circular polarization converter 50 so that it is converted into right-handed circular polarization (RHCP) and left-handed circular polarization (LHCP). The converted circularly polarized light proceeds along the current sensing optical waveguide coil 70 and is subjected to the effect of a magnetic field generated by the current applied to the electric wire 1 positioned at the center of the coil 70. The reflection mirror 90 attached to the end of the optical waveguide causes the waveguided light to propagate along the opposite direction in reverse so that the light follows the above-described path in reverse order. In this manner, the length in which light waves are affected by the magnetic field increases twice and the effect of linear birefringence of the optical waveguide is canceled.

The incident light input to the reflection mirror 90 along the optical waveguide returns its original linear polarization state while being reflected and resent. FIG. 2 shows this at the bottom portion thereof. Referring to FIG. 1 and FIG. 2, when the circularly polarized component is reflected on the reflection mirror 90, the LHCP component is converted back into RHCP and the RHCP component is converted back into LHCP. Next, when each circularly polarized light is passed from the circular polarization converter 50, it is converted into linearly polarized light. It is to be noted that, the linearly polarized light is output with an angular deviation of 90° as compared to the incident light. As can be seen from FIG. 2, the horizontal polarization (dotted line in FIG. 2) of the incident light is converted into the vertical polarization (dotted line in FIG. 2). Similarly, the vertical polarization (solid line in FIG. 2) of the incident light is converted into the horizontal polarization (solid line in FIG. 2). Each linearly polarized light is passed through a second optical coupler 10*a* and divided into an upper optical waveguide and a lower optical waveguide. The light propagating along the upper optical waveguide is passed through the phase modulator 30 and the linear polarization converter 40, so that it is converted into polarized light rotated by 90°. Herein, the phase modulator 30 functions to determine the relative phase difference between the light propagating through the upper optical waveguide and the light propagating through the lower optical waveguide. The phase modulator 30 also determines the relative phase difference in such a manner that the finally output light provides maximized interference signals. The light propagating passed through the lower optical waveguide is sent to a delay line 60 and causes a phase delay effect occurring during the input of the incident light. As a result, as shown in FIG. 2, the rear wave of the two waves propagating through the upper optical waveguide and the front wave of the two waves propagating through the lower optical waveguide meet again on the same time axis. The rear wave passed from the upper optical waveguide and the front wave passed from the lower optical waveguide have the same vertical polarization, propagate through the polarizers 20,20*a*, and thus finally cause interference at the optical coupler 10.

When any external current is not applied to the current sensing optical waveguide coil 70, the two light rays arriving at the optical coupler 10 have no phase difference between them, and thus cause light coupling at a ratio of 50:50 so that 50% of the light is transferred to the photodetector 200. When external current is applied to cause the Faraday effect, the light rays arriving at the optical coupler 10 have a phase difference. When the phase difference is +90°, the coupled light waves are output by the photodetector 200 at a ratio of 100%. When the phase difference is −90°, the coupled light waves propagate toward the light source 100, while no output light is transferred to the photodetector 200. It is possible to measure the value of current applied from the exterior on the basis of the above-described principle.

The integrated optical current sensor disclosed herein is advantageous in that it overcomes the most serious problem in commercialization of the existing optical sensors, the problem being that the sensors have characteristics varied with a change in external temperature or optical waveguide structure.

Figure 3:
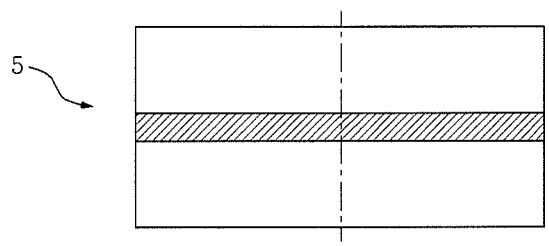
FIG. 3 shows a plane view and a sectional view illustrating the structure of the polymer optical waveguide in the polymer optical waveguide current sensor according to the present disclosure.
Figure 4:
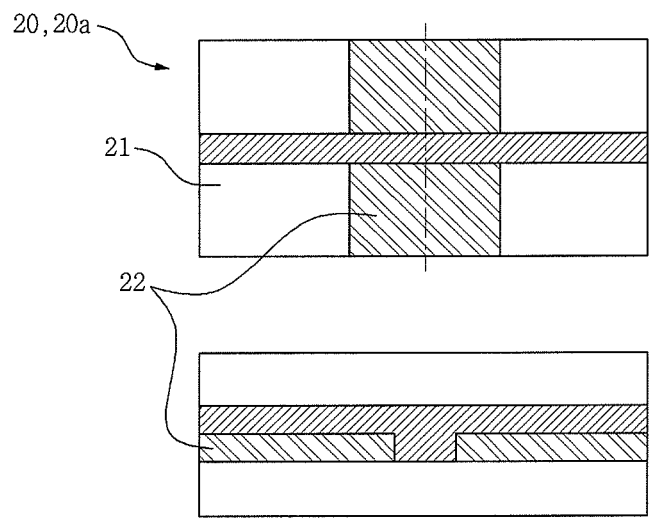
FIG. 4 shows a plane view and a sectional view illustrating the structure of the optical waveguide polarizer in the polymer optical waveguide current sensor according to the present disclosure.
Figure 5:
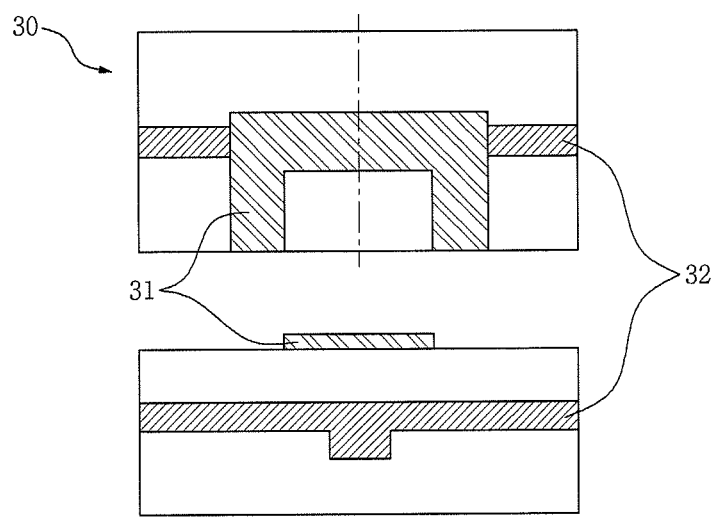
FIG. 5 shows a plane view and a sectional view illustrating the structure of the phase modulator in the polymer optical waveguide current sensor according to the present disclosure.

As shown in FIG. 3-FIG. 5, main optical waveguide elements forming the integrated optical current sensor disclosed herein are a polarization-maintaining optical waveguide 5, an optical waveguide polarizer 20 or 20*a*, and a thermo-optic phase modulator 30.

The integrated optical current sensor measures current by using a change in polarization of the wave-guided light. Thus, it is required that the light waves that pass through the optical waveguide have polarization-maintaining characteristics so that they cause no change in polarization due to factors other than the applied current. For this purpose, the optical sensor disclosed herein uses a rib type optical waveguide in which the structure of the optical waveguide 5 is asymmetrically inverted along the vertical direction and the horizontal direction, as shown in FIG. 3.

The optical couplers 10, 10*a* forming the current sensor are made to have two polarization-maintaining optical waveguides adjacent to each other so that the waves propagating along the two optical waveguides cause directional coupling.

As shown in FIG. 4, the optical waveguide polarizers 20, 20*a* may be fabricated by using a polymer material having birefringence property. When the circumference of the core portion of the optical waveguide 21 is coated with a birefringence polymer layer 22, the wave-guided light is affected in terms of waveguide conditions depending on direction of polarization. The birefringence polymer generally has a high refractive index to horizontal polarization. Therefore, horizontally polarized wave-guided light goes out through a cladding portion having a higher refractive index than the core portion of the optical waveguide while not passing through the polarizer. Fabrication of optical waveguide polarizers is described in detail in M. Oh, et al., "TE-pass and TM-pass waveguide polarizers with buried birefringence polymer," Electronics Letters, Vol. 35, No. 6, pp. 471-472, March 1999.

The thermo-optic phase modulator 30 as shown in FIG. 5 is required to compensate for a phase change in light waves caused by additional birefringence property of a current sensor, and is one of the core parts of the optical current sensor disclosed herein. The integrated phase modulator disclosed herein may be operated in such a manner that the optical sensor maintains its optimized condition by modulating feedback signals applied to the phase modulator so that the sensor provides signals maintaining their highest magnitude. Polymer materials show a significant change in refractive index depending on a change in temperature. Based on this, polymer materials are applicable to fabrication of optical switches, optical attenuators, etc. (Min-Cheol Oh, Hyung-Jong Lee, Myung-Hyun Lee, Joo-Heon Ahn, and Seon Gyu Han, "Asymmetric X-junction thermooptic switches based on fluorinated polymer waveguides," IEEE Photonics Technology Letters, Vol. 10, No. 6, pp. 813-815, June 1998; Young-Ouk Noh, Chul-Hee Lee, Jong-Min Kim, Wol-Yon Hwang, Min-Cheol Oh, Yong Hyub Won, Hyung-Jong Lee and Seon-Gyu Han, "Polymer waveguide variable optical attenuator and its reliability," Optics Communications, Vol. 242, pp. 533-540, 2004). When applying current to the thin film heater 31 positioned at the top of the optical waveguide, heat is generated by a resistor part, resulting in a change in refractive index of the optical waveguide 32. The waves propagating along the optical waveguide having such a changed refractive index undergo a change in phase. Such phase modulation is required to initialize the current sensor, and does not need high-speed operation. Therefore, a polymer element using a thermo-optic effect is suitable for such phase modulation.

Figure 6:
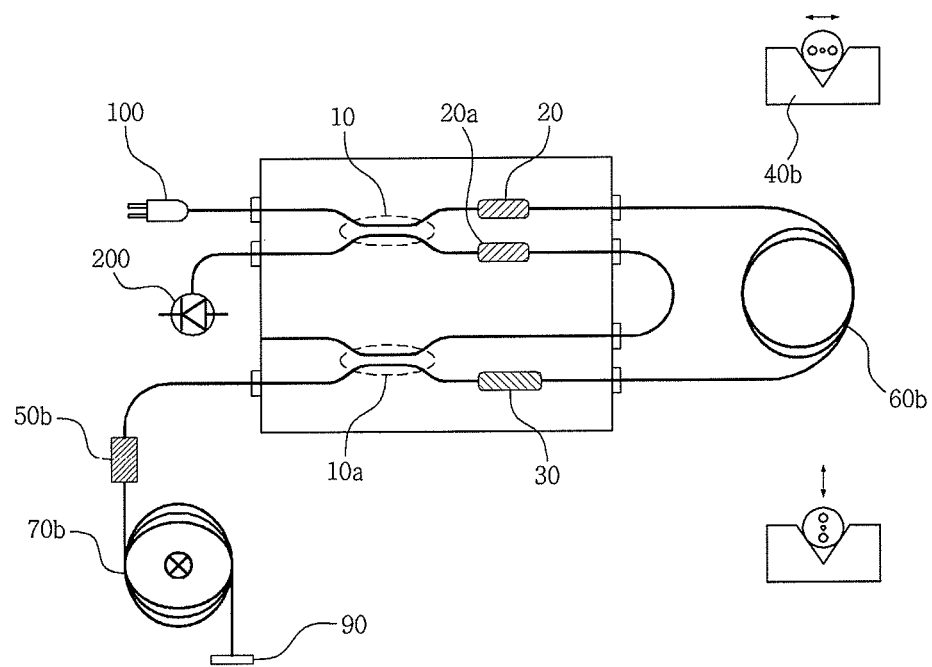
FIG. 6 is a schematic view of the polymer optical waveguide current sensor according to another embodiment of the present disclosure.

The core parts forming the current sensor using a polymer optical waveguide include optical couplers 10, 10a, a waveguide polarizer 20, and a thermo-optic phase modulator 30. The other parts may be substituted with optical fibers. The linear polarization converter 40b, the delay line 60b and the circular polarization converter 50b may be substituted with polarization-containing optical fibers and the current sensing optical fiber coil 70b may be substituted with single mode optical fibers to form a hybrid type optical waveguide current sensor as shown in FIG. 6. The linear polarization converter 40b may be substituted with optical fibers by aligning polarization-maintaining optical fibers on silicone v-groove after rotating them by 90°, and then adhering them to the optical waveguide. The polarization converter may be fabricated by inserting a thin film-like half wavelength plate in the middle of the optical waveguide. Thus, the light that passes out through the optical waveguide after horizontal polarization is converted into vertically polarized light and is input again to the optical waveguide element. In addition, the vertically polarized light is input again as horizontally polarized light and functions to perform 90° conversion of linearly polarized light. As shown in FIG. 6, the delay line 60b may be formed by using polarization-maintaining optical fibers extending the propagation path of light while maintaining polarization. The current sensing optical fiber coil 70b may be formed by winding single mode optical fibers around the electric wire through which current flows. In addition, the circular polarization converter 50b present at the front end of the optical fiber coil may be formed integrally with the optical fiber coil by using polarization-maintaining optical fibers.

The hybrid type optical waveguide current sensor includes optical couplers 10, 10a, an optical waveguide polarizer 20, and a thermo-optic phase modulator 30 that may be fabricated most efficiently by using polymer optical waveguide elements, as well as the other parts fabricated by using optical fibers. The hybrid type optical waveguide current sensor has a simplified structure while maintaining its function as a current sensor.

Those skilled in the art will appreciate that the conceptions and specific embodiments disclosed in the foregoing description may be readily utilized as a basis for modifying or designing other embodiments for carrying out the same purposes of the present disclosure. Those skilled in the art will also appreciate that such equivalent embodiments do not depart from the spirit and scope of the disclosure as set forth in the appended claims.

Industrial Applicability

The optical sensors using optical fibers according to the related art are disadvantageous in that they use expensive components and require a complicated process for assembling the components and producing sensors. On the contrary, the optical current sensor based on integrated-optic technology disclosed herein enables mass production of chips having identical functions on a single substrate through a series of processing operations by introducing an integrated circuit fabrication process. As a result, it is possible to reduce cost required for manufacturing optical current sensors and to extend the spectrum of applications thereof.

The invention claimed is:

1. A polymer optical waveguide current sensor, comprising:
   an optical coupler to which light generated from a light source is input;
   an optical waveguide polarizer allowing the light emitted from the optical coupler to have a single polarized state;
   a phase modulator modulating a phase of the light emitted from the optical waveguide polarizer;
   a linear polarization converter converting the polarization of the light passed from the optical waveguide polarizer and transferring the light to the phase modulator;
   a current sensing optical fiber coil, through which the light passed from the phase modulator passes while undergoing a change in phase under an effect of a magnetic field generated by current applied to an electric wire provided at the center of the optical fiber coil; and
   a photo-detector in which the light emitted from the current sensing optical fiber coil reflects on a reflection mirror to detect returned light,
   wherein the optical coupler, the optical waveguide polarizer, the phase modulator and the linear polarization converter are integrated totally on a single chip.

2. The polymer optical waveguide current sensor according to claim 1, wherein the optical coupler, the optical waveguide polarizer and the phase modulator each are manufactured by using a polymer optical waveguide.

3. The polymer optical waveguide current sensor according to claim 1, wherein the phase modulator comprises a thin film heater provided on a top of the optical waveguide, and a refraction index of the optical waveguide is changed by the heat generated from the thin film heater under application of current.

4. The polymer optical waveguide current sensor according to claim 1, which further comprises:
   a delay line allowing light passed from a second optical waveguide polarizer via the optical coupler to appear as a delayed form on a time axis;
   a second optical coupler where the light passed from the phase modulator meets the light passed from the delay line;
   an optical attenuator causing a loss of a portion of the light passed from the second optical coupler; and
   a circular polarization converter converting the polarization of another portion of the light passed from the second optical coupler,
   wherein the light passed from the optical coupler is allowed to cause interference at the second optical coupler after being passed from the optical waveguide polarizer , the linear polarization converter and the phase modulator so that a phase condition of the light is detected as a function of magnitude of current.

5. The polymer optical waveguide current sensor according to claim 1, wherein the optical coupler uses a directional optical coupler structure or a multi-mode interference system structure, and has identical operational properties regardless of the polarization of the wave-guided light.

6. The polymer optical waveguide current sensor according to claim 1, wherein the optical waveguide polarizer has a selective transmission property to either TE polarized light or TM polarized light, and has a structure into which a birefringence polymer material is inserted or a structure using surface plasmon absorption of a metal thin film.

7. The polymer optical waveguide current sensor according to claim 1, wherein feedback signals applied to the phase modulator are controlled to allow the sensor to maintain a maximized signal magnitude, so that the optical sensor is maintained at its optimized condition by the phase modulator.

8. The polymer optical waveguide current sensor according to claim 1, wherein the linear polarization converter is obtained by inserting a thin film-like half-wave plate in the middle of the optical waveguide.

* * * * *